(12) United States Patent
Gumpher

(10) Patent No.: US 8,440,578 B2
(45) Date of Patent: May 14, 2013

(54) GCIB PROCESS FOR REDUCING INTERFACIAL ROUGHNESS FOLLOWING PRE-AMORPHIZATION

(75) Inventor: John Gumpher, Niskayuna, NY (US)

(73) Assignee: TEL Epion Inc., Billerica, MA (US)

( * ) Notice: Subject to any disclaimer, the term of this patent is extended or adjusted under 35 U.S.C. 154(b) by 303 days.

(21) Appl. No.: 13/073,540

(22) Filed: Mar. 28, 2011

(65) Prior Publication Data

US 2012/0252222 A1 Oct. 4, 2012

(51) Int. Cl.
| | |
|---|---|
| *H01L 21/36* | (2006.01) |
| *H01L 21/20* | (2006.01) |
| *H01L 21/425* | (2006.01) |
| *H01L 21/461* | (2006.01) |
| *H01L 21/302* | (2006.01) |
| *H01L 21/469* | (2006.01) |

(52) U.S. Cl.
USPC ........... 438/766; 438/478; 438/514; 438/712; 438/765; 438/961; 257/E21.146; 257/E21.159; 257/E21.241; 257/E21.269; 257/E21.467

(58) Field of Classification Search ................. 438/368, 438/478, 514–515, 519, 712, 765, 766, 961, 438/964; 257/E21.146, E21.159, E21.214, 257/E21.241, E21.269, E21.467
See application file for complete search history.

(56) References Cited

U.S. PATENT DOCUMENTS

| | | | |
|---|---|---|---|
| 6,537,606 B2 | 3/2003 | Allen et al. | |
| 6,797,339 B2 * | 9/2004 | Akizuki et al. | 427/562 |
| 7,060,989 B2 | 6/2006 | Swenson et al. | |
| 7,173,252 B2 | 2/2007 | Mack | |
| 7,883,999 B2 | 2/2011 | Shao et al. | |
| 2005/0202657 A1 * | 9/2005 | Borland et al. | 438/514 |
| 2009/0317564 A1 * | 12/2009 | Hautala et al. | 427/563 |
| 2010/0200774 A1 * | 8/2010 | Burke et al. | 250/492.21 |
| 2010/0227142 A1 | 9/2010 | Hautala et al. | |

\* cited by examiner

*Primary Examiner* — Mohsen Ahmadi

(74) *Attorney, Agent, or Firm* — Wood, Herron & Evans, LLP

(57) ABSTRACT

A method for amorphizing a layer on a substrate is described. In one embodiment, the method includes treating the substrate with a first gas cluster ion beam (GCIB) using a first beam energy selected to yield an amorphous sub-layer within the substrate of a desired thickness, which produces a first interfacial roughness of an amorphous-crystal interface between the amorphous sub-layer and a crystalline sub-layer of the substrate. The method further includes treating the substrate with a second GCIB using a second beam energy, less than the first beam energy, to reduce the first interfacial roughness of the amorphous-crystal interface to a second interfacial roughness.

18 Claims, 8 Drawing Sheets

GCIB PROCESS FOR REDUCING INTERFACIAL ROUGHNESS FOLLOWING PRE-AMORPHIZATION

BACKGROUND OF THE INVENTION

1. Field of Invention

The invention relates to forming an amorphous layer in a substrate.

2. Description of Related Art

The useful characteristics of semiconductor materials, such as silicon, germanium and gallium arsenide as well as other semiconductors, are contingent upon the purity and crystal structure of the semiconductor material. Dopant atoms incorporated into semiconductor materials for the purpose of altering electrical properties, forming electronic junctions, etc., are often introduced into a semiconductor surface by conventional ion implantation.

During the conventional process of ion implantation, ionized dopant atoms are physically deposited into a crystalline semiconductor material, but it is well known that, in doing so, the crystal lattice of the semiconductor becomes damaged by the implantation process. In order for the implanted dopant atoms to become electrically active within the semiconductor and to restore the desirable crystallinity of the semiconductor, the semiconductor crystal lattice structure must be restored and the implanted dopant atoms must occupy lattice sites within the restored crystal lattice by substitution. Processes typically employed to produce crystal lattice restoration and electrical activation of implanted dopant atoms include elevated temperature thermal annealing, pulsed laser beam annealing and pulsed electron beam annealing.

For some semiconductor products, an important requirement for the introduction of dopants into the semiconductor surface is that the maximum depth to which the dopant has penetrated after completion of the lattice re-crystallization and dopant activation processes must be kept very shallow, often only a few hundred Angstroms or less. By using very low energy conventional ion implantation, such shallow introduction of dopant is feasible by using very low implantation energies on the order of less than 1000 eV or in some cases even less than 200 eV. However, at such low energy, conventional ion implant often suffers from an energy contamination problem. When implanting some dopants, such as boron (B), a channeling effect is unavoidable unless the silicon (Si) lattice is pre-amorphized before the dopant implant. In conventional ion implant, this technique is known as pre-amorphization implant (PAI). High energy germanium (Ge) is often used for such purpose. The Ge PAI not only helps to prevent channeling but also helps to reduce B diffusion during anneal. But Ge PAI causes implant damage, often referred to as end-of-range damage that cannot be corrected by annealing. Such end-of-range damage results in high leakage current and other negative effect to devices.

Gas cluster ion beams (GCIBs) are used for etching, cleaning, smoothing, and forming thin films. For purposes of this discussion, gas clusters are nano-sized aggregates of materials that are gaseous under low-pressure, ultra-high vacuum (UHV) conditions used in typical ion implantation processes. Such gas clusters may consist of aggregates including a few to several thousand molecules, or more, that are loosely bound together through Van der Waals interaction. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion.

The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

However, conventional GCIB processes still suffer from various deficiencies. Even with the aforementioned advantageous outcomes, GCIB processes can produce an uneven, pitted interface between the GCIB treated surface layer and the underlying untreated layer. There is thus a need to improve upon the use of GCIB processing for pre-amorphizing semiconductor materials to reduce interfacial deficiencies.

SUMMARY OF THE INVENTION

The invention relates to forming an amorphous sub-layer within a portion of a substrate. In particular, methods for amorphizing layers, including silicon-containing films, on a substrate using gas cluster ion beam (GCIB) processing are described in various embodiments. More specifically, the invention relates to forming an amorphous sub-layer using a first GCIB. According to one embodiment, the method further includes using a second GCIB to reduce an interfacial roughness between the amorphous sub-layer formed using the first GCIB and a crystalline sub-layer underlying the amorphous sub-layer.

According to another embodiment, a method for amorphizing a portion of a substrate is described. In one embodiment, the method may include treating at least a first portion of the substrate with a first GCIB using a first beam energy selected to yield an amorphous sub-layer from the first portion within the substrate of a desired thickness, wherein a second portion of the substrate is a crystalline sub-layer, and wherein the first GCIB treatment produces a first interfacial roughness of an amorphous-crystal interface between the amorphous sub-layer and the crystalline sub-layer of the substrate. The method further includes treating at least the first portion of the substrate with a second GCIB using a second beam energy, less than the first beam energy, to reduce the first interfacial roughness of the amorphous-crystal interface to a second interfacial roughness.

DETAILED DESCRIPTION OF SEVERAL EMBODIMENTS

Figure 1:
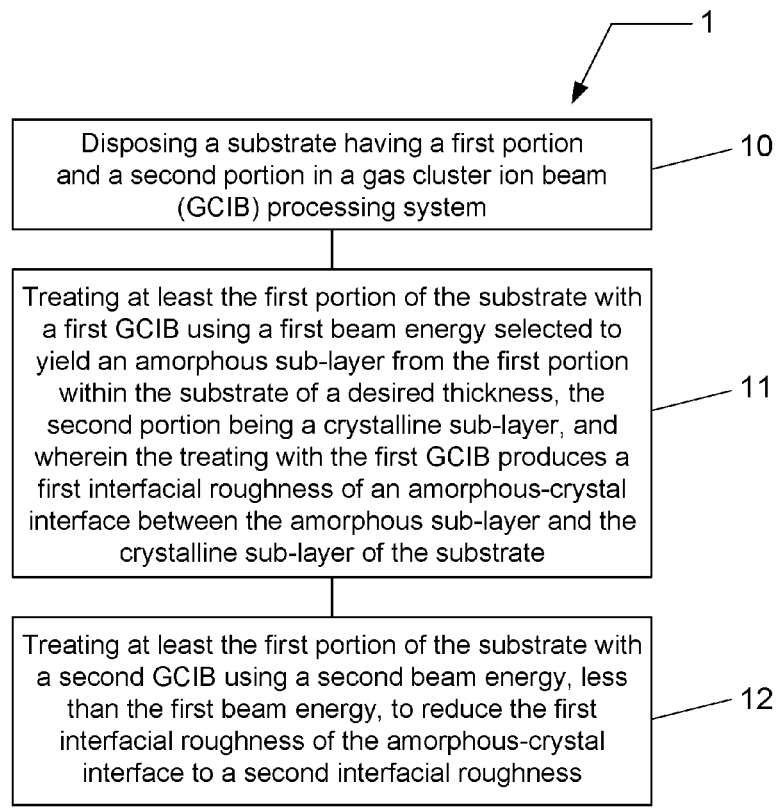
FIG. 1 is a flow chart illustrating a method for amorphizing a layer on a substrate according to an embodiment.

Methods for amorphizing layers, including silicon-containing films, on a substrate using gas cluster ion beam (GCIB) processing are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

As described above, when treating a substrate or layer on or portion of a substrate, GCIB processes can produce an uneven, pitted interface between the GCIB treated surface layer or portion and the underlying untreated layer or portion. For example, when producing an amorphous sub-layer within a substrate using GCIB processing, the resultant interfacial roughness of an amorphous-crystal interface formed between the amorphous sub-layer, created using GCIB processing, and a crystalline sub-layer of the substrate that underlies the amorphous sub-layer can be unacceptable. In some cases, an uneven amorphous-crystalline interface with severe pitting can be observed.

Therefore, according to various embodiments, methods for amorphizing a layer on or portion of a substrate, while reducing interfacial roughness between an amorphous sub-layer and an underlying crystalline sub-layer, are disclosed. Referring now to the drawings wherein like reference numerals designate corresponding parts throughout the several views, FIG. 1 provides a flow chart 1 illustrating a method for amorphizing a layer on a substrate according to an embodiment. Furthermore, a method for amorphizing a layer on a substrate is described in FIGS. 2A through 2D.

The method illustrated in flow chart 1 begins in 10 with disposing a substrate 50 in a GCIB processing system. At least a first portion 50a of substrate 50 is arranged to be exposed to one or more GCIB treatments, while a second portion 50b that underlies the first portion 50a remains untreated. The substrate 50 may include conductive materials, semi-conductive materials, or dielectric materials, or any combination of two or more thereof. For example, the substrate 50 may include a semiconductor material, such as silicon or germanium or a combination thereof. Additionally, for example, the substrate 50 may include crystalline silicon.

Figure 2A:
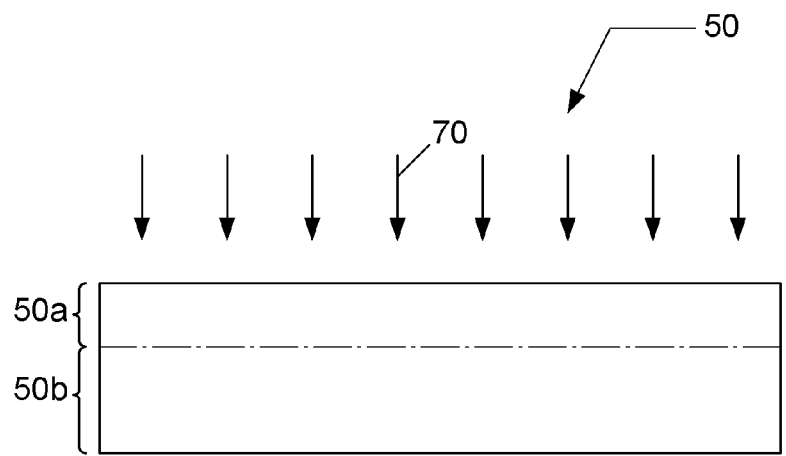
FIGS. 2A through 2D illustrate in schematic view a method for amorphizing a layer on a substrate according to another embodiment.
Figure 2B:
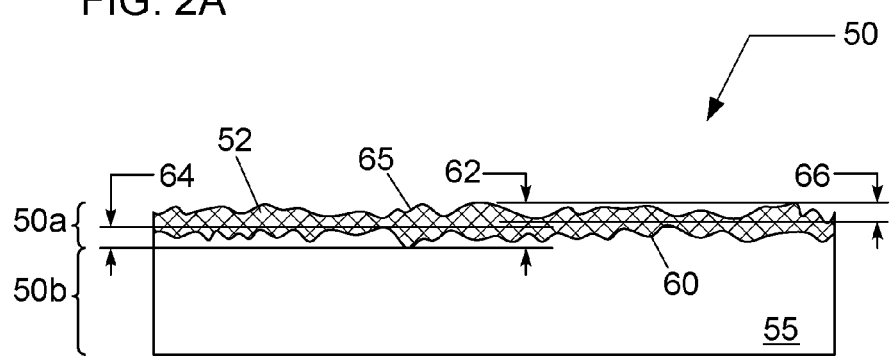

In 11, as shown in FIGS. 2A and 2B, the first portion 50a of substrate 50 is treated with a first GCIB 70 using a first beam energy selected to yield an amorphous sub-layer 52 from the first portion 50a within substrate 50 of a desired thickness 62, while the second portion 50b remains untreated as a crystalline sub-layer 55. The treating of substrate 50 with the first GCIB 70 producing a first interfacial roughness 64 of an amorphous-crystal interface 60 between the amorphous sub-layer 52 and the crystalline sub-layer 55 of substrate 50. The crystalline sub-layer 55 of substrate 50 may include crystalline silicon, and the amorphous sub-layer 52 may include amorphous silicon. In one embodiment, the first and second portions 50a, 50b of substrate 50 may comprise crystalline silicon, and the first portion 50a is then amorphized by the GCIB treatment to yield amorphous silicon as amorphous sub-layer 52, while leaving the second portion 50b of crystalline silicon as crystalline sub-layer 55.

Figure 2C:
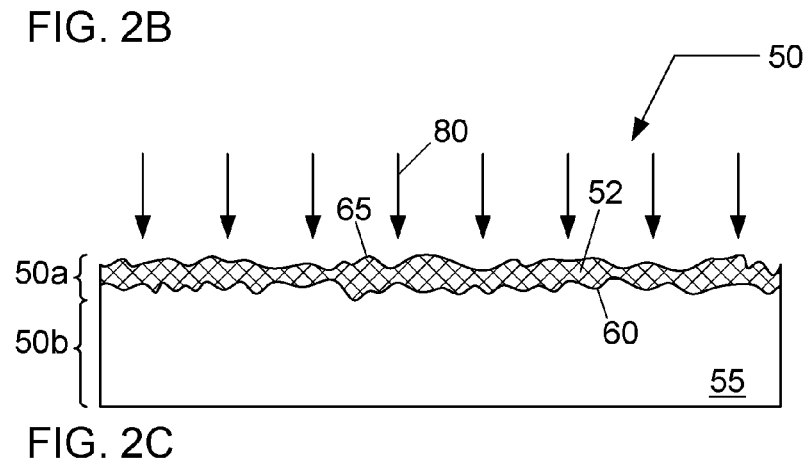
Figure 2D:
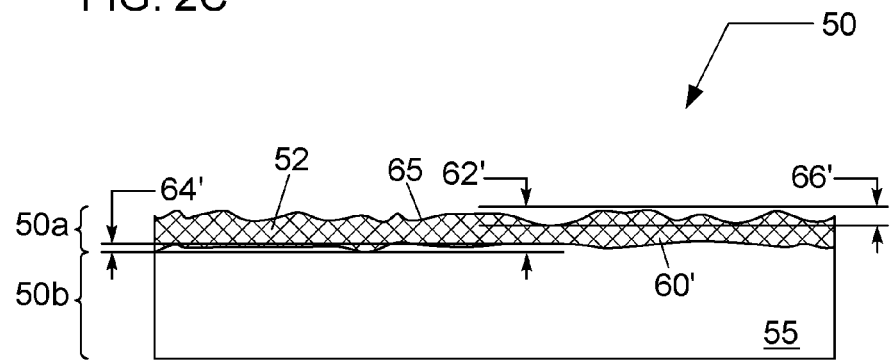

In 12, as shown in FIGS. 2C and 2D, the first portion 50a of substrate 50 is treated with a second GCIB 80 using a second beam energy, less than the first beam energy, to reduce the first interfacial roughness 64 of the amorphous-crystal interface 60 to a second interfacial roughness 64', thus forming a modified amorphous-crystal interface 60'. The GCIB treatment of substrate 50 with second GCIB 80 may produce a final thickness 62' that is substantially the same as the desired thickness 62. The first GCIB 70 may be substantially the same beam as the second GCIB 80, wherein the beam energy is adjusted from the first beam energy to the second beam energy in a continuous manner or a stepwise manner. Alternatively, the first GCIB 70 is different than the second GCIB 80, wherein the beam energy is adjusted from the first beam energy to the second beam energy in a stepwise manner.

Additionally, the second GCIB 80 may be effective to reduce a first surface roughness 66 of an exposed surface 65 of the amorphous sub-layer 52 to a second surface roughness 66'. Alternatively, or in addition, the first portion 50a of substrate 50 may be treated with a third GCIB (not shown) using a third beam energy, less than the first beam energy to obtain the second surface roughness 66' or even a further reduced surface roughness. Furthermore, the third beam energy may be less than the second beam energy.

The degree of interfacial roughness and/or surface roughness may be a measure of the interfacial and/or surface unevenness. For example, the interfacial roughness and/or surface roughness may be characterized mathematically as a maximum roughness ($R_{max}$), an average roughness ($R_a$), or a root-mean-square (rms) roughness ($R_q$).

The first GCIB 70 and/or second GCIB 80 can be formed in a GCIB processing system, such as any of the GCIB processing systems (100, 100' or 100") described below in FIG. 5, 6 or 7, or any combination thereof. Therein, substrate 50 may be provided and maintained in a reduced-pressure environment. Substrate 50 may be positioned on a substrate holder and may be securely held by the substrate holder. The temperature of substrate 50 may or may not be controlled. For example, substrate 50 may be heated or cooled during a GCIB treatment process.

The first GCIB 70 and/or second GCIB 80 may be generated from a pressurized gas mixture that includes a noble gas (i.e., He, Ne, Ar, Kr, Xe). Additionally, the first GCIB 70 and/or second GCIB 80 may be generated from a pressurized gas mixture that includes at least one noble gas and molecules containing an element, or elements, selected from the group consisting of B, C, Se, Te, Si, Ge, N, P, As, O, S, F, Cl, and Br. Furthermore, the first GCIB 70 and/or second GCIB 80 may be generated from a pressurized gas mixture that includes at least one dopant, etchant, or film forming constituent for depositing or growing a thin film, or any combination of two or more thereof.

For example, the first GCIB 70 and/or second GCIB 80 may be generated from a pressurized gas mixture selected from the partial list of gases consisting of He, Ne, Ar, Kr, Xe, $SiH_4$, $Si_2H_6$, $SiH_2Cl_2$, $SiCl_3H$, methylsilane, dimethylsilane, trimethylsilane, tetramethylsilane, ethylsilane, diethylsilane, triethylsilane, tetraethylsilane, $SiCl_4$, $SiF_4$, $GeH_4$, $Ge_2H_6$, $GeH_2Cl_2$, $GeCl_3H$, methylgermane, dimethylgermane, trimethylgermane, tetramethylgermane, ethylgermane, diethylgermane, triethylgermane, tetraethylgermane, $GeCl_4$, $GeF_4$, $N_2$, $H_2$, $O_2$, NO, $NO_2$, $N_2O$, $NH_3$, $NF_3$, HCl, $SF_6$, CO, $CO_2$, $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, $C_6H_{12}$, $BF_3$, $B_2H_6$, $AsH_3$, $AsF_5$, $PH_3$, $PF_3$, $PCl_3$, or $PF_5$, or any combination of two or more thereof. It should be reiterated that this list of gases is not intended to be a complete list, and that other gases not included in this list can be used to generate gas cluster ion beams.

As described above, two or more GCIB treatments may be programmed to modify and/or enhance substrate 50. For example, the first GCIB 70 and the second GCIB 80 may be programmed to produce an amorphous sub-layer having a desired thickness and an acceptable interfacial roughness at the amorphous-crystal interface between the amorphous sub-layer and the underlying crystalline sub-layer. In any one of these GCIB treatments, including the first GCIB 70 and/or the second GCIB 80, a GCIB operation may comprise: establishing a GCIB; selecting at least one of a beam energy, a beam energy distribution, a beam focus, and a beam dose; accelerating the GCIB to achieve the beam energy; focusing the GCIB to achieve the beam focus; and exposing the portion of the substrate to the accelerated GCIB according to the beam dose.

Furthermore, in addition to beam energy, beam energy distribution, beam focus, and beam dose, a stagnation pressure, a stagnation temperature, a mass flow rate, a cluster size, a cluster size distribution, a beam size, a beam composition, a beam electrode potential, or a gas nozzle design (such as nozzle throat diameter, nozzle length, and/or nozzle divergent section half-angle) may be selected. Any one or more of the aforementioned GCIB properties can be selected to achieve pre-specified properties of the substrate 50, including the amorphous sub-layer 52. For example, any one of these GCIB properties may be adjusted to alter properties of the substrate 50, i.e., alter a phase (amorphous or crystalline) of a sub-layer within the substrate, alter a thickness of a sub-layer within the substrate, alter an interfacial roughness of a sub-layer within the substrate, alter a surface roughness of a sub-layer within the substrate, alter a concentration of one or more species within the substrate, alter a concentration profile of one or more species within the substrate, or alter a depth of one or more species within the substrate, or any combination thereof.

For the first GCIB 70 and/or the second GCIB 80, the beam acceleration potential may range up to 100 kV, the beam energy may range up to 100 keV, the cluster size may range up to several tens of thousands of atoms, and the beam dose may range up to about $1 \times 10^{17}$ clusters per $cm^2$. For example, the beam acceleration potential of the first GCIB 70 and/or the second GCIB 80 may range from about 1 kV to about 70 kV (i.e., the beam energy may range from about 1 keV to about 70 keV, assuming an average cluster charge state of unity). Additionally, for example, the beam dose of the first GCIB 70 and/or the second GCIB 80 may range from about $1 \times 10^{12}$ clusters per $cm^2$ to about $1 \times 10^{14}$ clusters per $cm^2$.

The first GCIB 70 and/or second GCIB 80 may be established having an energy per atom ratio ranging from about 0.25 eV per atom to about 100 eV per atom. Alternatively, the first GCIB 70 and/or second GCIB 80 may be established having an energy per atom ratio ranging from about 0.25 eV per atom to about 10 eV per atom. Alternatively, the first GCIB 70 and/or second GCIB 80 may be established having an energy per atom ratio ranging from about 1 eV per atom to about 10 eV per atom.

The establishment of the first GCIB 70 and/or the second GCIB 80 having a desired energy per atom ratio may include selection of a beam acceleration potential, a stagnation pressure for formation of the first GCIB 70 and/or the second GCIB 80, or a gas flow rate, or any combination thereof. The beam acceleration potential may be used to increase or decrease the beam energy or energy per ion cluster. For example, an increase in the beam acceleration potential causes an increase in the maximum beam energy and, consequently, an increase in the energy per atom ratio for a given cluster size. Additionally, the stagnation pressure may be used to increase or decrease the cluster size for a given cluster. For example, an increase in the stagnation pressure during formation of the GCIB causes an increase in the cluster size (i.e., number of atoms per cluster) and, consequently, a decrease in the energy per atom ratio for a given beam acceleration potential.

As described above, the second beam energy is selected to be less than the first beam energy. The first beam energy may be greater than about 1 keV (kilo-electron volts). Alternatively, the first beam energy may be greater than about 5 keV. Alternatively, the first beam energy may be greater than about 10 keV. Alternatively, the first beam energy may be greater than about 20 keV. Alternatively yet, the first beam energy may be greater than about 30 keV. The second beam energy may be less than about 30 keV. Alternatively, the second beam energy may be less than about 20 keV. Alternatively, the second beam energy may be less than about 10 keV. Alternatively yet, the second beam energy may be less than about 5 keV. Alternately yet, the second beam energy may be less than about 1 keV.

Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface of the substrate per unit area (i.e., number of clusters per unit area per unit time) may be held constant while the time is varied to change the beam dose.

According to one embodiment, the GCIB treatment may comprise selecting the first beam energy and a first beam dose to achieve desired thickness 62 of the amorphous sub-layer 52 formed during the irradiating of the portion of the substrate 50 with the first GCIB 70. Additionally, the GCIB treatment may further comprise selecting the second beam energy and a second beam dose to achieve second interfacial roughness 64' of the amorphous sub-layer 52 formed during the irradiating the portion of the substrate 50 with the second GCIB 80.

Figure 3:
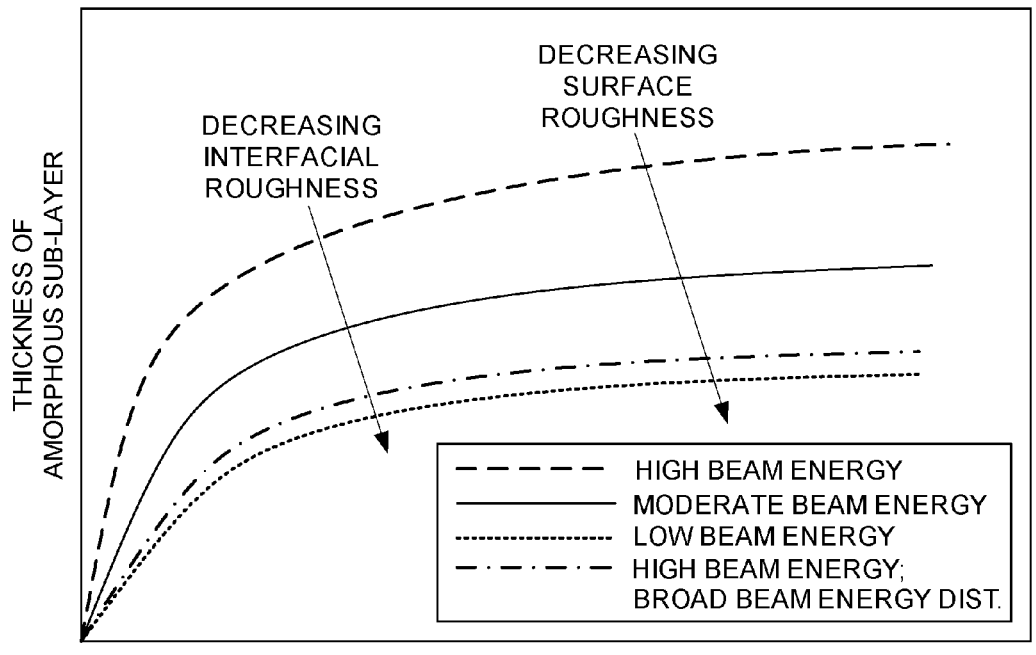
FIG. 3 graphically depicts exemplary data for amorphizing a layer on a substrate.

Referring now to FIG. 3, the thickness of the amorphous sub-layer 52 is plotted as a function of time (or beam dose), wherein the thickness increases with time until it eventually saturates. The maximum thickness and the elapsed time associated with substantially achieving the maximum thickness of the amorphous sub-layer 52 depend on the beam energy or beam acceleration potential, i.e., the first beam energy. For example, three exemplary data sets are illustrated for low beam energy (or low beam acceleration potential) (dotted line), moderate beam energy (or moderate beam acceleration potential) (solid line), and high beam energy (or high beam acceleration potential) (dashed line). In each data set, the beam energy (e.g., high, moderate, low) represents the peak beam energy for a relatively narrow beam energy distribution.

Additionally, the first interfacial roughness 64 (measured as average roughness, $R_a$) and the first surface roughness 66 (measured as average roughness, $R_a$) depends on the beam acceleration potential or beam energy, i.e., the first beam energy. As the beam acceleration or beam energy is increased to achieve the desired thickness 62, the first interfacial roughness 64 and first surface roughness 66 are increased. Conversely, as the beam acceleration or beam energy is decreased to achieve the desired thickness 62, the first interfacial roughness 64 and first surface roughness 66 are decreased, as shown by the arrows in FIG. 3.

Furthermore, while not shown in FIG. 3, the first interfacial roughness 64 and first surface roughness 66 may be decreased by decreasing the energy per atom ratio. Alternatively, the first interfacial roughness 64 and first surface roughness 66 may be increased by increasing the energy per atom ratio.

As will be discussed in greater detail below, GCIB treatment with the second GCIB 80 may be used to reduce the first interfacial roughness 64 to the second interfacial roughness 64' and to achieve the final thickness 62'. GCIB treatment with the second GCIB 80 may, at least in part, reduce the first surface roughness 66 to the second surface roughness 66'. Furthermore, additional GCIB treatment, for example with a third GCIB, may be used to reduce the first surface roughness 66 to the second surface roughness 66'. The same parameters for the first GCIB 70 that can be selected and adjusted to achieve the first interfacial/surface roughness 64, 66 and desired thickness 62 can likewise be selected and adjusted for the second GCIB 80 to achieve the second interfacial/surface roughness 64', 66' and final thickness 62'.

Referring again to FIG. 3, for example, a fourth exemplary data set is illustrated for high beam energy (or high beam acceleration potential) and broad beam energy distribution (dashed-dot line). The thickness varies with time in a manner similar to the relatively low beam energy and narrow beam energy distribution data (dotted line), yet the first and second interfacial roughness 64, 64' and first and second surface roughness 66, 66' may be further reduced.

The beam energy distribution function for the first GCIB 70 and/or the second GCIB 80 may be modified by directing the respective GCIB along a GCIB path through an increased pressure region such that at least a portion of the GCIB traverses the increased pressure region. The extent of modification to the beam energy distribution may be characterized by a pressure-distance (d) integral along the at least a portion of the GCIB path. When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. As an example, one may broaden the beam energy distribution to decrease the interfacial/surface roughness 64, 64', 66, 66', or one may narrow the beam energy distribution to increase the interfacial/surface roughness 64, 64', 66, 66', as described above.

The pressure-distance integral along the at least a portion of the GCIB path may be equal to or greater than about 0.0001 torr-cm. Alternatively, the pressure-distance integral along the at least a portion of the GCIB path may be equal to or greater than about 0.001 torr-cm. Alternatively yet, the pressure-distance integral along the at least a portion of the GCIB path may be equal to or greater than about 0.01 torr-cm.

Alternatively, the beam energy distribution function for the first GCIB 70 and/or the second GCIB 80 may be modified by modifying or altering a charge state of the respective GCIB. For example, the charge state may be modified by adjusting an electron flux, an electron energy, or an electron energy distribution for electrons utilized in electron collision-induced ionization of gas clusters.

As described above, when a desired thickness 62 is selected and achieved using the first GCIB 70, the resultant amorphous sub-layer 52 exhibits interfacial roughness 64 at the amorphous-crystalline interface 60 representative of the exemplary data provided in FIG. 3. Thereafter, the amorphous sub-layer 52 is subjected to treatment by the second GCIB 80, having second beam energy less than the first beam energy, and the interfacial roughness 64 is further reduced.

Figure 4A:
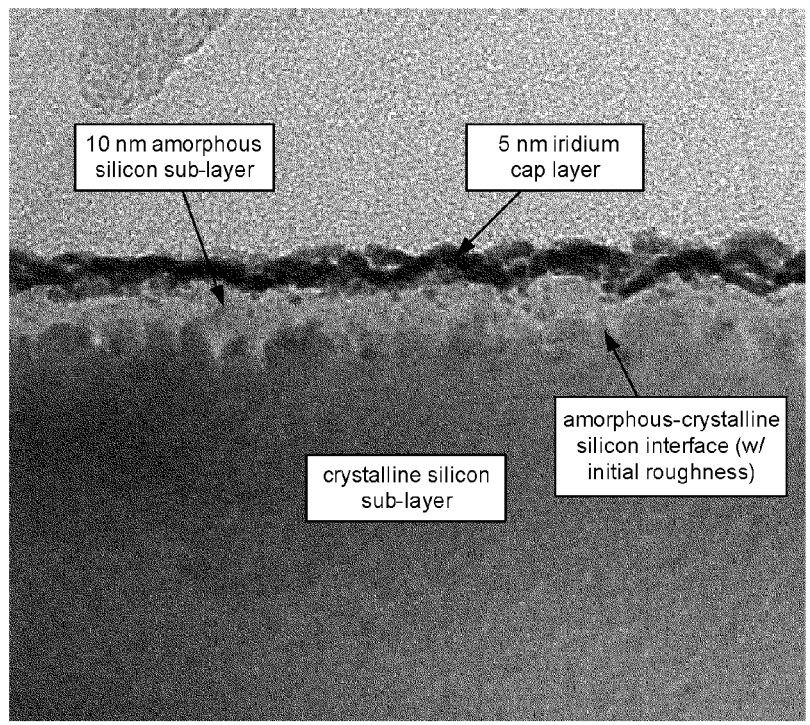
FIGS. 4A and 4B are micrographs depicting an amorphous sub-layer formed on a substrate and subsequent interfacial treatment according to an embodiment.
Figure 4B:
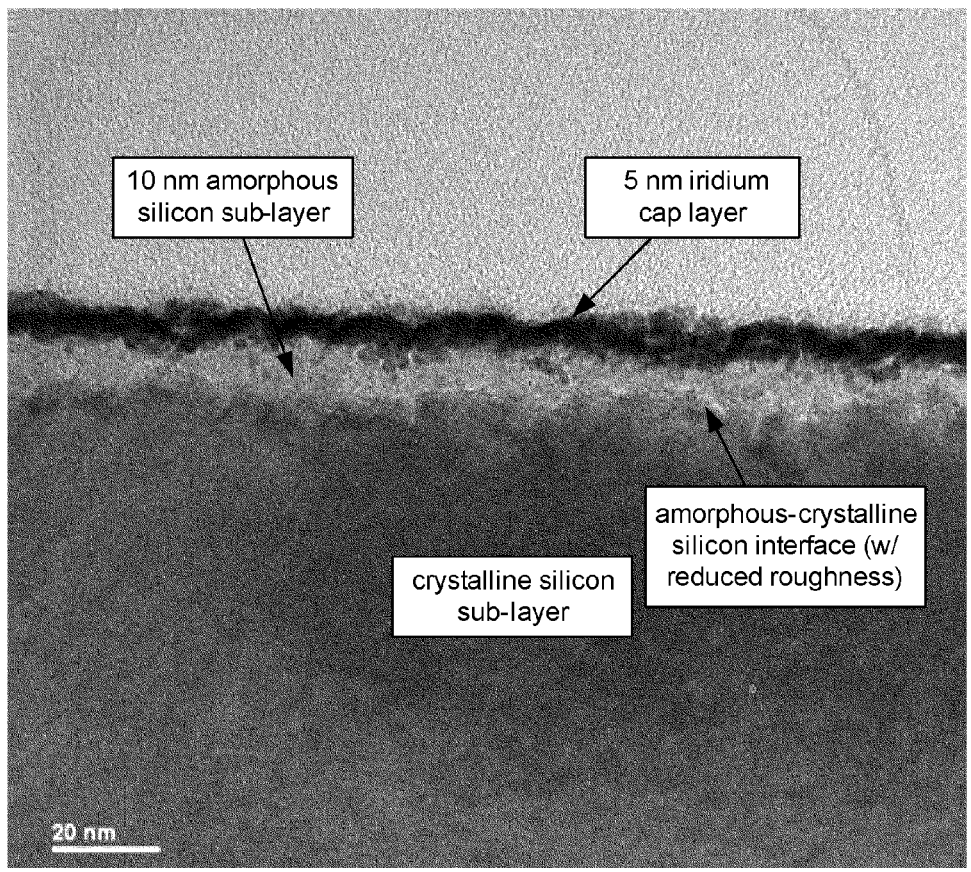

Referring now to FIGS. 4A and 4B, an amorphous silicon sub-layer is formed in a crystalline silicon substrate using GCIB treatment. In FIG. 4A, a 10 nm (nanometer) thick amorphous silicon sub-layer is formed using a first GCIB at a beam acceleration potential of 10 kV. A 5 nm iridium cap layer is formed above the amorphous sub-layer to provide greater contrast to the amorphous silicon sub-layer (lighter layer) sandwiched between the underlying crystalline silicon sub-layer (dark layer) and the iridium cap layer (darker layer). Inspection of the amorphous silicon sub-layer indicates that the amorphous-crystalline interface exhibits heavy pitting and may be characterized with a high degree of interfacial roughness.

In FIG. 4B, the amorphous silicon sub-layer is subjected to a second GCIB at a beam acceleration potential of 8 kV (a beam acceleration potential, and corresponding beam energy, less than the beam acceleration potential and beam energy of the first GCIB). Inspection of the amorphous silicon sub-layer indicates that the interfacial roughness of the amorphous-crystalline interface is substantially reduced.

According to another embodiment, the first GCIB 70 and/or second GCIB 80 may be used to form a mixed layer in substrate 50, wherein the mixed layer is either graded or non-graded. Additionally, the mixed layer may include one or more elements, dopants, and/or impurities infused using the first GCIB 70 and/or second GCIB 80. Furthermore, the mixed layer may include a concentration profile extending partly or fully through the mixed layer that is tailored via adjustment of one or more GCIB processing parameters of the first GCIB 70 and/or second GCIB 80. The mixed layer may or may not coincide with the amorphous sub-layer 52.

The beam acceleration potential (or beam energy, e.g., the first beam energy) may be used to modify the thickness 62, 62', or depth of penetration of the one or more elements in the substrate 50, i.e., increasing the beam acceleration potential increases the thickness or depth of penetration, and decreasing the beam acceleration potential decreases the thickness or depth of penetration. Additionally, the beam dose may be used to modify the concentration of the one or more elements in the substrate 50, i.e., increasing the beam dose increases the amorphization or final concentration, and decreasing the beam dose decrease the amorphization or final concentration. The first GCIB 70 and/or the second GCIB 80 may be accelerated according to the beam acceleration potential, and the substrate 50 is exposed to the first GCIB 70 and/or the second GCIB 80 according to the beam dose.

Furthermore, the energy per atom ratio may be used to adjust the concentration of one or more elements present or not present in the substrate 50, the thickness 62, 62' or depth of penetration to which the one or more elements are present in the substrate 50. For instance, while decreasing the energy per atom ratio, the depth of penetration may be decreased. Alternatively, while increasing the energy per atom ratio, the depth of penetration may be increased.

According to another embodiment, the first GCIB 70 and/or second GCIB 80 may be used to grow a sub-layer on substrate 50, wherein the grown layer is either graded or non-graded. The growth process may, for example, include an oxidation or nitridation process. Additionally, the grown layer may include one or more elements, dopants, and/or impurities infused using the first GCIB 70 and/or second GCIB 80. Furthermore, the grown layer may include a concentration profile extending partly or fully through the grown layer that is tailored via adjustment of one or more GCIB processing parameters of the first GCIB 70 and/or second GCIB 80. The grown layer may or may not coincide with the amorphous sub-layer 52. As described above, one or more GCIB parameters may be adjusted to achieve a desired thickness or depth of penetration of the grown layer.

According to another embodiment, in addition to irradiation of substrate 50 with the first GCIB 70 and second GCIB 80, another GCIB may be used for additional control and/or function. Irradiation of the substrate 50 by another GCIB, such as the third GCIB, may proceed before, during, or after use of the first GCIB 70 and/or second GCIB 80. For example, another GCIB may be used to dope a portion of the substrate 50 with an impurity. Additionally, for example, another GCIB may be used to modify a portion of the substrate 50 to alter properties of substrate 50. Additionally, for example, another GCIB may be used to etch a portion of the substrate 50 to remove material from substrate 50. Additionally yet, for example, another GCIB may be used to grow or deposit material on a portion of the substrate 50. The doping, modifying, etching, growing, or depositing may comprise introducing one or more elements selected from the group consisting of He, Ne, Ar, Xe, Kr, B, C, Se, Te, Si, Ge, N, P, As, O, S, F, Cl, and Br.

According to another embodiment, the first portion 50a of substrate 50 subjected to GCIB irradiation may be cleaned before or after the irradiating with the first GCIB 70 and/or the second GCIB 80. For example, the cleaning process may include a dry cleaning process and/or a wet cleaning process. Additionally, the first portion 50a of substrate 50 subjected to GCIB irradiation may be annealed after the irradiating with the first GCIB 70 and/or the second GCIB 80.

According to another embodiment, one or more thermal anneals may be performed to program, modify, and/or enhance the amorphous sub-layer 52 and properties in substrate 50. For any one of these thermal anneals, the substrate 50 may be subjected to a thermal treatment, wherein the temperature of the substrate 50 is elevated to a material-specific temperature for a period of time. The temperature and the time for the annealing process may be adjusted in order to vary the properties of the substrate 50. For example, the temperature of the substrate 50 may be elevated to a value greater than about 800 degrees C. Additionally, for example, the temperature of the substrate may be elevated to a value greater than about 850 degrees C. Additionally yet, for example, the temperature of the substrate may be elevated to a value greater than about 900 degrees C. Furthermore, for example, the time for the annealing process may be greater than about 1 millisecond. The annealing process may be performed at atmospheric pressure or reduced pressure. Additionally, the annealing process may be performed with or without an inert gas atmosphere. Furthermore, the annealing process may be performed in a furnace, a rapid thermal annealing (RTP) system, a flash lamp annealing system, or a laser annealing system.

According to another embodiment, when preparing substrate 50, any portion of substrate 50 or the amorphous-crystal interface 60 may be subjected to corrective processing. During corrective processing, metrology data may be acquired using a metrology system coupled to a GCIB processing system, either in-situ or ex-situ. The metrology system may comprise any variety of substrate diagnostic systems including, but not limited to, optical diagnostic systems, X-ray fluorescence spectroscopy systems, four-point probing systems, transmission-electron microscope (TEM), atomic force microscope (AFM), scanning-electron microscope (SEM), etc. Additionally, the metrology system may comprise an optical digital profilometer (ODP), a scatterometer, an ellipsometer, a reflectometer, an interferometer, or any combination of two or more thereof.

For example, the metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). Additionally, for example, the in-situ metrology system may include an integrated Optical Digital Profilometry (iODP) scatterometry module configured to measure metrology data on a substrate.

The metrology data may include parametric data, such as geometrical, mechanical, electrical and/or optical parameters associated with the substrate, any layer or sub-layer formed on the substrate, and/or any portion of a device on the substrate. For example, metrology data can include any parameter measurable by the metrology systems described above. Additionally, for example, metrology data can include a film thickness, a surface and/or interfacial roughness, a surface contamination, a feature depth, a trench depth, a via depth, a feature width, a trench width, a via width, a critical dimension (CD), an electrical resistance, or any combination of two or more thereof.

The metrology data may be measured at two or more locations on the substrate. Moreover, this data may be acquired and collected for one or more substrates. The one or more substrates may, for instance, include a cassette of substrates. The metrology data is measured at two or more locations on at least one of the one or more substrates and may, for example, be acquired at a plurality of locations on each of the one or more substrates. Thereafter, the plurality of locations on each of the plurality of substrates can be expanded from measured sites to unmeasured sites using a data fitting algorithm. For example, the data fitting algorithm can include interpolation (linear or nonlinear) or extrapolation (linear or nonlinear) or a combination thereof.

Once metrology data is collected for the one or more substrates using the metrology system, the metrology data is provided to a controller for computing correction data. Metrology data may be communicated between the metrology system and the controller via a physical connection (e.g., a cable), or a wireless connection, or a combination thereof. Additionally, the metrology data may be communicated via an intranet or Internet connection. Alternatively, metrology data may be communicated between the metrology system and the controller via a computer readable medium.

Correction data may be computed for location specific processing of the substrate. The correction data for a given substrate comprises a process condition for modulation of the GCIB dose as a function of position on the substrate in order to achieve a change between the parametric data associated with the incoming metrology data and the target parametric data for the given substrate. For example, the correction data for a given substrate can comprise determining a process condition for using the GCIB to correct a non-uniformity of the parametric data for the given substrate. Alternatively, for example, the correction data for a given substrate can comprise determining a process condition for using the GCIB to create a specifically intended non-uniformity of the parametric data for the given substrate.

Using an established relationship between the desired change in parametric data and the GCIB dose and an established relationship between the GCIB dose and a GCIB process condition having a set of GCIB processing parameters, the controller determines correction data for each substrate. For example, a mathematical algorithm can be employed to take the parametric data associated with the incoming metrology data, compute a difference between the incoming parametric data and the target parametric data, invert the GCIB processing pattern (i.e., etching pattern or deposition pattern or both) to fit this difference, and create a beam dose contour to achieve the GCIB processing pattern using the relationship between the change in parametric data and the GCIB dose. Thereafter, for example, GCIB processing parameters can be determined to affect the calculated beam dose contour using the relationship between the beam dose and the GCIB process condition. The GCIB processing parameters can include a beam dose, a beam area, a beam profile, a beam intensity, a beam scanning rate, or an exposure time (or beam dwell time), or any combination of two or more thereof.

Many different approaches to the selection of mathematical algorithm may be successfully employed in this embodiment. In another embodiment, the beam dose contour may selectively deposit additional material in order to achieve the desired change in parametric data.

The correction data may be applied to the substrate using a GCIB. During corrective processing, the GCIB may be configured to perform at least one of smoothing, amorphizing, modifying, doping, etching, growing, or depositing, or any combination of two or more thereof. The application of the corrective data to the substrate may facilitate correction of substrate defects, correction of substrate surface planarity, correction of layer thickness, or improvement of layer adhesion. Once processed to GCIB specifications, the uniformity of the substrate(s) or distribution of the parametric data for the substrate(s) may be examined either in-situ or ex-situ, and the process may be finished or refined as appropriate.

According to yet another embodiment, a method for patterning the GCIB treatment of substrate 50, including GCIB treatment with the first GCIB 70 and the second GCIB 80, is described. The method comprises forming a patterned mask layer on a surface of substrate 50, treating a surface of substrate 50 exposed through the patterned mask layer using the first GCIB 70, the second GCIB 80, and/or another GCIB, and removing the patterned mask layer. The use of a patterned mask layer during the GCIB treatment with the first GCIB 70, the second GCIB 80, and/or another GCIB can facilitate patterning the distribution of GCIB treatment across substrate 50.

The patterned mask layer may be formed by coating substrate 50 with a layer of radiation-sensitive material, such as photo-resist. For example, photo-resist may be applied to the substrate using a spin coating technique, such as those processes facilitated by a track system. Additionally, for example, the photo-resist layer is exposed to an image pattern using a photo-lithography system, and thereafter, the image pattern is developed in a developing solvent to form a pattern in the photo-resist layer.

The photo-resist layer may comprise 248 nm (nanometer) resists, 193 nm resists, 157 nm resists, or EUV (extreme ultraviolet) resists. The photo-resist layer can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

The exposure to electro-magnetic (EM) radiation through a reticle is performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134).

The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

The photo-resist layer may be removed using a wet stripping process, a dry plasma ashing process, or a dry non-plasma ashing process.

The patterned mask layer may include multiple layers, wherein the pattern formed in the multi-layer mask layer may be created using wet processing techniques, dry processing techniques, or a combination of both techniques. The formation of a patterned mask layer having a single layer or multiple layers is understood to those skilled in the art of lithography and pattern etching technology.

Figure 5:
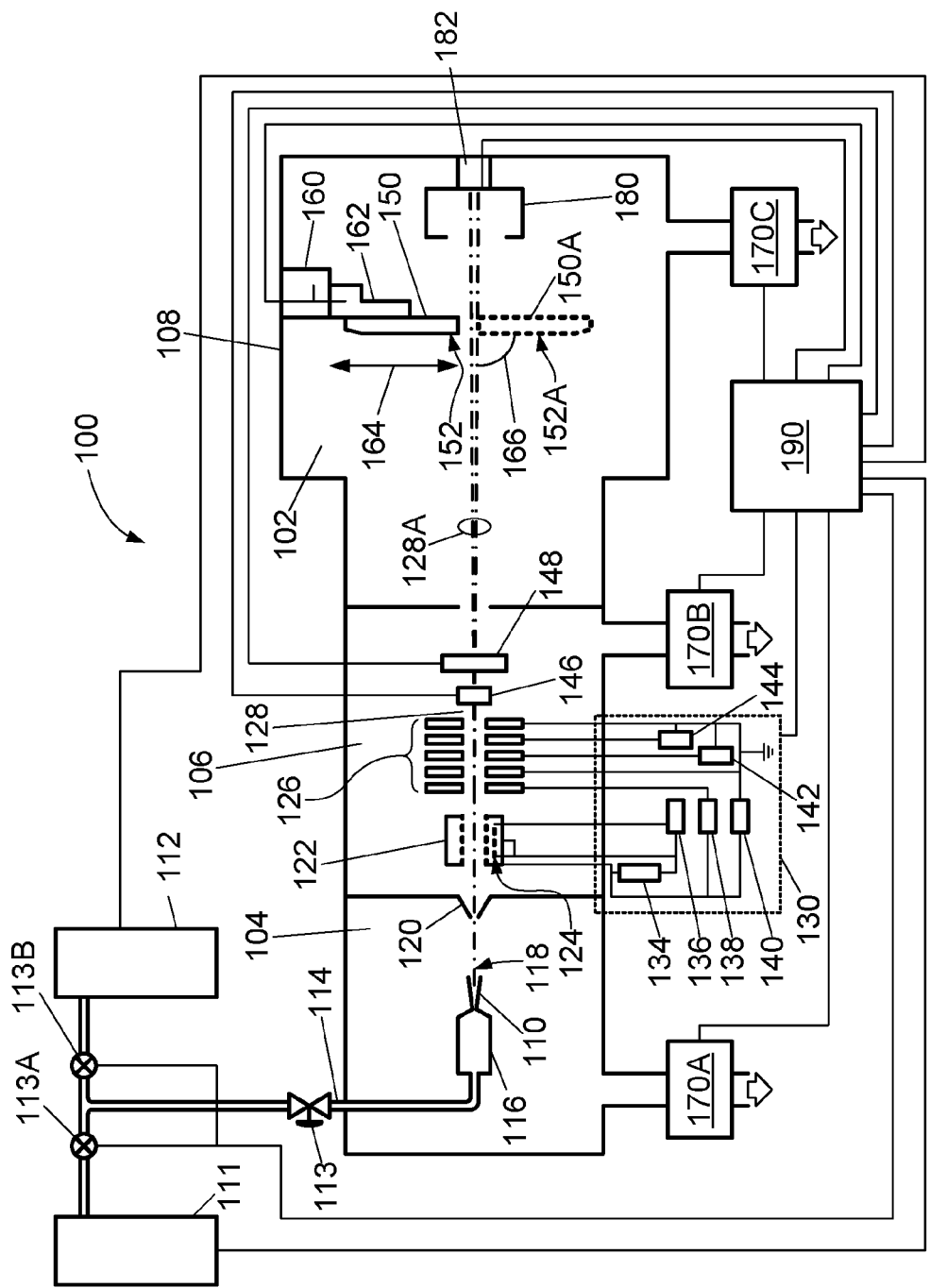
FIG. 5 is an illustration of a GCIB processing system.

Referring now to FIG. 5, a GCIB processing system 100 for treating a substrate as described above is depicted according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 5, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

Although specific examples are provided for transistor gate and trench capacitor applications, the methods of etching, as described above, may be utilized in any substrate processing wherein etching is necessitated.

As shown in FIG. 5, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Further, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 111 and the second gas source 112 may be utilized either alone or in combination with one another to produce ionized clusters. The material composition can include the principal atomic or molecular species of the elements desired to be introduced to the material layer.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 5, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 4, the beam electronics 130 further include an anode power supply 134 that provides voltage $V_A$ to an anode of ionizer 122 for accelerating electrons emitted from filament 124 and causing the electrons to bombard the gas clusters in gas cluster beam 118, which produces cluster ions.

Additionally, as illustrated in FIG. 4, the beam electronics 130 include an extraction power supply 138 that provides voltage $V_{EE}$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{ACC}$ to bias one of the high voltage electrodes 126 with respect to the ionizer 122 so as to result in a total GCIB acceleration energy equal to about $V_{ACC}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{ACC}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 5, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 5, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a Faraday cup or the like, closed except for a beam-entry opening, and is typically affixed to the wall of the vacuum vessel 102 with an electrically insulating mount 182.

As shown in FIG. 5, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 6:
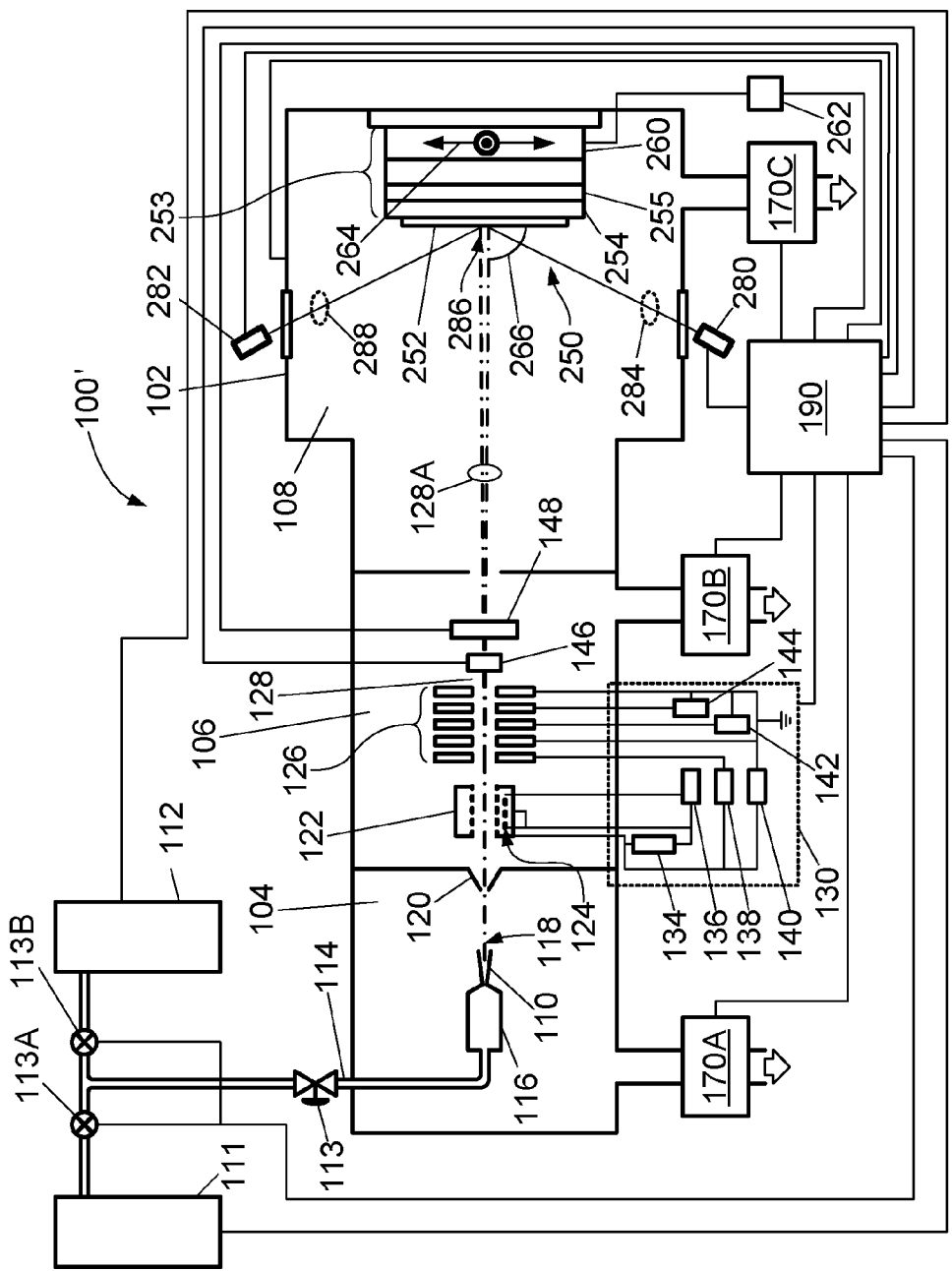
FIG. 6 is another illustration of a GCIB processing system.

In the embodiment shown in FIG. 6, the GCIB processing system 100' can be similar to the embodiment of FIG. 5 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 5) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 7:
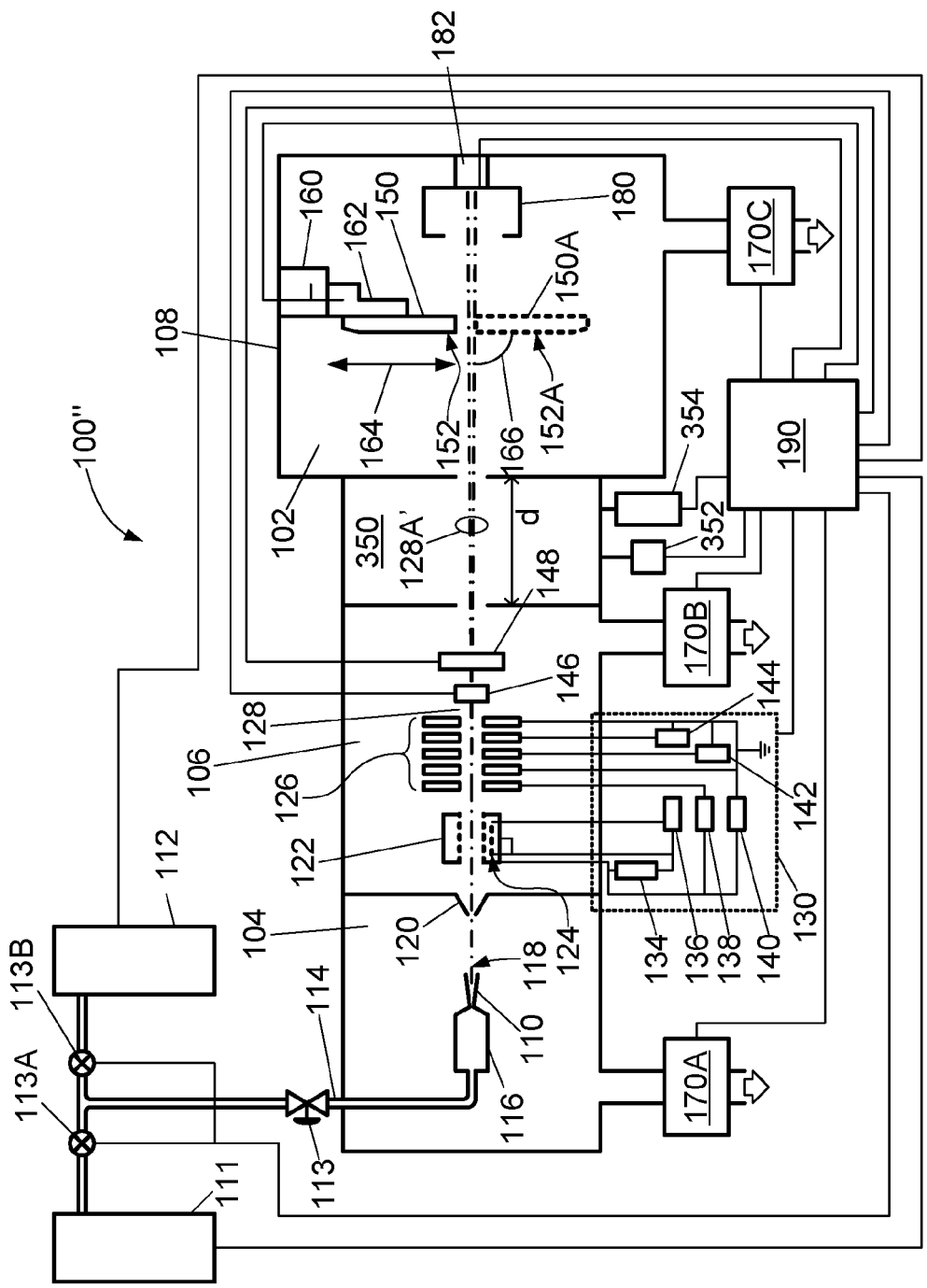
FIG. 7 is yet another illustration of a GCIB processing system.

In the embodiment shown in FIG. 7, the GCIB processing system 100" can be similar to the embodiment of FIG. 5 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along the at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled "Method and apparatus for improved processing with a gas-cluster ion beam"; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the Internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the Internet. Furthermore, another computer (i.e., controller, server, etc.) can access control system 190 to exchange data via a direct connection, an intranet, and/or the Internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 8:
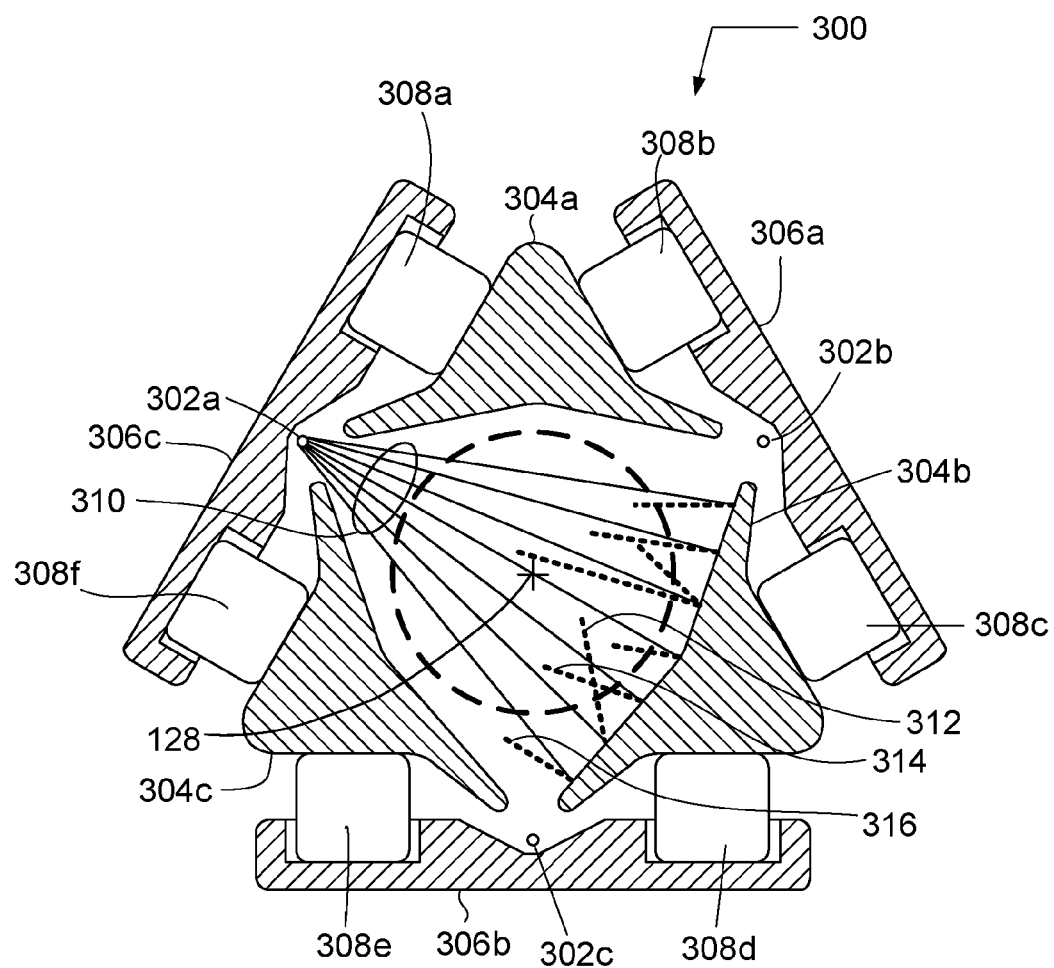
FIG. 8 is an illustration of an ionization source for a GCIB processing system.

Referring now to FIG. 8, a section 300 of a gas cluster ionizer (122, FIGS. 5, 6 and 7) for ionizing a gas cluster jet (gas cluster beam 118, FIGS. 5, 6 and 7) is shown. The section 300 is normal to the axis of GCIB 128. For typical gas cluster sizes (2000 to 15000 atoms), clusters leaving the skimmer aperture (120, FIGS. 5, 6 and 7) and entering an ionizer (122, FIGS. 5, 6 and 7) will travel with a kinetic energy of about 130 to 1000 electron volts (eV). At these low energies, any departure from space charge neutrality within the ionizer 122 will result in a rapid dispersion of the jet with a significant loss of beam current. FIG. 8 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Figure 9:
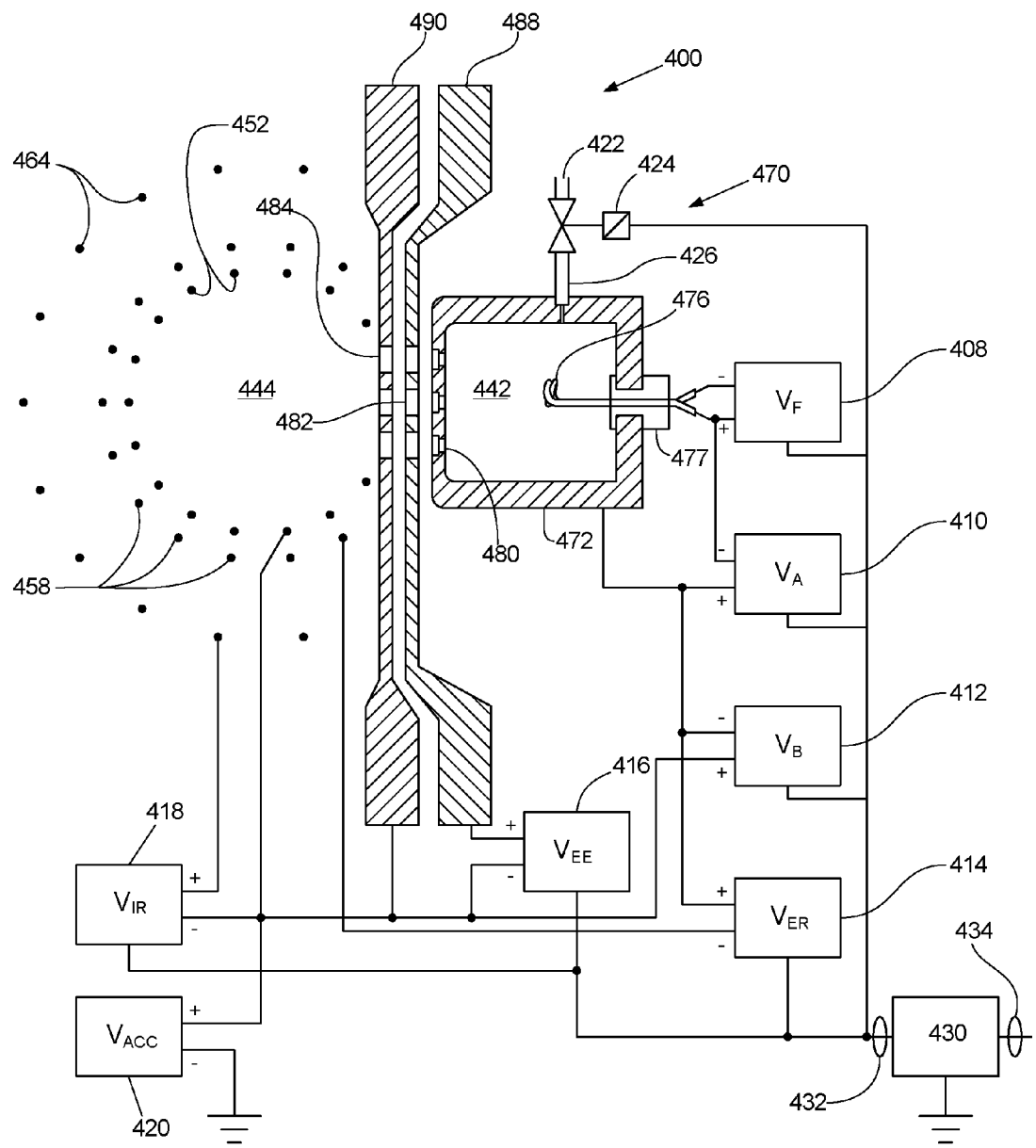
FIG. 9 is an illustration of another ionization source for a GCIB processing system.

Alternatively, ionizers may use electron extraction from plasma to ionize clusters. The geometry of these ionizers is quite different from the three filament ionizer described above but the principles of operation and the ionizer control are very similar. Referring now to FIG. 9, a section 400 of a gas cluster ionizer (122, FIGS. 5, 6 and 7) for ionizing a gas cluster jet (gas cluster beam 118, FIGS. 5, 6 and 7) is shown. The section 400 is normal to the axis of GCIB 128. For typical gas cluster sizes (2000 to 15000 atoms), clusters leaving the skimmer aperture (120, FIGS. 5, 6 and 7) and entering an ionizer (122, FIGS. 5, 6 and 7) will travel with a kinetic energy of about 130 to 1000 electron volts (eV). At these low energies, any departure from space charge neutrality within the ionizer 122 will result in a rapid dispersion of the jet with a significant loss of beam current. FIG. 9 illustrates a self-neutralizing ionizer. As with other ionizers, gas clusters are ionized by electron impact.

The ionizer includes an array of thin rod anode electrodes 452 that is supported and electrically connected by a support plate (not shown). The array of thin rod anode electrodes 452 is substantially concentric with the axis of the gas cluster beam (e.g., gas cluster beam 118, FIGS. 5, 6 and 7). The ionizer also includes an array of thin rod electron-repeller rods 458 that is supported and electrically connected by another support plate (not shown). The array of thin rod electron-repeller electrodes 458 is substantially concentric with the axis of the gas cluster beam (e.g., gas cluster beam 118, FIGS. 5, 6 and 7). The ionizer further includes an array of thin rod ion-repeller rods 464 that is supported and electrically connected by yet another support plate (not shown). The array of thin rod ion-repeller electrodes 464 is substantially concentric with the axis of the gas cluster beam (e.g., gas cluster beam 118, FIGS. 5, 6 and 7).

Energetic electrons are supplied to a beam region 444 from a plasma electron source 470. The plasma electron source 470 comprises a plasma chamber 472 within which plasma is formed in plasma region 442. The plasma electron source 470 further comprises a thermionic filament 476, a gas entry aperture 426, and a plurality of extraction apertures 480. The thermionic filament 476 is insulated from the plasma chamber 470 via insulator 477. As an example, the thermionic filament 476 may include a tungsten filament having one-and-a-half turns in a "pigtail" configuration.

The section 400 of the gas cluster ionizer comprises an electron-acceleration electrode 488 having plural apertures 482. Additionally, the section 400 comprises an electron-deceleration electrode 490 having plural apertures 484. The plural apertures 482, the plural apertures 484, and the plural extraction apertures 480 are all aligned from the plasma region 442 to the beam region 444.

Plasma forming gas, such as a noble gas, is admitted to the plasma chamber 472 through gas entry aperture 426. An insulate gas feed line 422 provides pressurized plasma forming gas to a remotely controllable gas valve 424 that regulates the admission of plasma forming gas to the plasma chamber 472.

A filament power supply 408 provides filament voltage ($V_F$) for driving current through thermionic filament 476 to stimulate thermo-electron emission. Filament power supply 408 controllably provides about 140 to 200 A (amps) at 3 to 5 V (volts). An arc power supply 410 controllably provides an arc voltage ($V_A$) to bias the plasma chamber 472 positive with respect to the thermionic filament 476. Arc power supply 410 is typically operated at a fixed voltage, typically about 35 V, and provides means for accelerating the electrons within the plasma chamber 472 for forming plasma. The filament current is controlled to regulate the arc current supplied by the arc power supply 410. Arc power supply 410 is capable of providing up to 5 A arc current to the plasma arc.

Electron deceleration electrode 490 is biased positively with respect to the plasma chamber 472 by electron bias power supply 412. Electron bias power supply 412 provides bias voltage ($V_B$) that is controllably adjustable over the range of from 30 to 400 V. Electron acceleration electrode 488 is biased positively with respect to electron deceleration electrode 490 by electron extraction power supply 416. Electron extraction power supply 416 provides electron extraction voltage ($V_{EE}$) that is controllable in the range from 20 to 250 V. An acceleration power supply 420 supplies acceleration voltage ($V_{ACC}$) to bias the array of thin rod anode electrodes 452 and electron deceleration electrode 490 positive with respect to earth ground. $V_{ACC}$ is the acceleration potential for gas cluster ions produced by the gas cluster ionizer shown in section 400 and is controllable and adjustable in the range from 1 to 100 kV. An electron repeller power supply 414 provides electron repeller bias voltage ($V_{ER}$) for biasing the array of thin rod electron-repeller electrodes 458 negative with respect to $V_{ACC}$. $V_{ER}$ is controllable in the range of from 50 to 100 V. An ion repeller power supply 418 provides ion repeller bias voltage ($V_{IR}$) to bias the array of thin rod ion-repeller electrodes 464 positive with respect to $V_{ACC}$. $V_{IR}$ is controllable in the range of from 50 to 150V.

A fiber optics controller 430 receives electrical control signals on cable 434 and converts them to optical signals on control link 432 to control components operating at high potentials using signals from a grounded control system. The fiber optics control link 432 conveys control signals to remotely controllable gas valve 424, filament power supply 408, arc power supply 410, electron bias power supply 412, electron repeller power supply 414, electron extraction power supply 416, and ion repeller power supply 418.

For example, the ionizer design may be similar to the ionizer described in U.S. Pat. No. 7,173,252, entitled "Ionizer and method for gas-cluster ion-beam formation"; the content of which is incorporated herein by reference in its entirety.

The gas cluster ionizer (122, FIGS. 5, 6 and 7) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for amorphizing a portion of a substrate, comprising:
    disposing a substrate having a first portion and a second portion therein in a gas cluster ion beam (GCIB) processing system;
    treating at least said first portion of said substrate with a first GCIB using a first beam energy selected to yield an amorphous sub-layer from said first portion within said substrate of a desired thickness, said second portion being a crystalline sub-layer, and said treating with said first GCIB producing a first interfacial roughness of an amorphous-crystal interface between said amorphous sub-layer and said crystalline sub-layer of said substrate; and then
    treating at least said first portion of said substrate with a second GCIB using a second beam energy, less than said first beam energy, to reduce said first interfacial roughness of said amorphous-crystal interface to a second interfacial roughness; and then
    treating said first portion of said substrate with a third GCIB using a third beam energy, less than said second beam energy, to reduce a surface roughness of an exposed surface of said amorphous sub-layer,
    wherein the method further comprises:
    forming a patterned mask layer on said substrate prior to said treating said first portion of said substrate using said first GCIB in order to cause patterning of said substrate; and
    removing said patterned mask layer.

2. The method of claim 1, wherein said first and second portions of said substrate contain silicon.

3. The method of claim 1, wherein said first and second portions of said substrate are crystalline silicon, and wherein said first GCIB produces an amorphous silicon sub-layer from said crystalline silicon of said first portion.

4. The method of claim 1, wherein said first beam energy is equal to or greater than 10 keV.

5. The method of claim 1, wherein said second beam energy is less than 10 keV.

6. The method of claim 1, wherein said treating with said first GCIB further comprises:
    selecting a first beam energy distribution, a first beam focus, or a first beam dose, or any combination of two or more thereof.

7. The method of claim 6, further comprising:
    modifying said first beam energy distribution to reduce said first interfacial roughness.

8. The method of claim 7, wherein said modifying said first beam energy distribution comprises directing said first GCIB along a GCIB path through an increased pressure region such that at least a portion of said GCIB path traverses said increased pressure region.

9. The method of claim 6, wherein said treating with said second GCIB further comprises:
    selecting a second beam energy distribution, a second beam focus, or a second beam dose, or any combination of two or more thereof.

10. The method of claim 9, further comprising:
    modifying said second beam energy distribution to reduce said second interfacial roughness.

11. The method of claim 10, wherein said modifying said second beam energy distribution comprises directing said second GCIB along a GCIB path through an increased pressure region such that at least a portion of said GCIB path traverses said increased pressure region.

12. The method of claim 1, wherein said first GCIB contains an element selected from a group consisting of He, Ne, Ar, Xe, Kr, B, C, Si, Ge, N, P, As, O, S, F, Cl, and Br.

13. The method of claim 1, wherein said first GCIB contains at least one noble gas and molecules including an element or elements selected from a group consisting of B, C, Si, Ge, N, P, As, O, S, F, Cl, and Br.

14. The method of claim 1, wherein said second GCIB contains an element selected from a group consisting of He, Ne, Ar, Xe, Kr, B, C, Si, Ge, N, P, As, O, S, F, Cl, and Br.

15. The method of claim 1, wherein said second GCIB contains at least one noble gas and molecules including an element or elements selected from a group consisting of B, C, Si, Ge, N, P, As, O, S, F, Cl, and Br.

16. The method of claim 1, wherein said treating said portion of said substrate with said second GCIB further comprises doping said amorphous sub-layer.

17. The method of claim 1, wherein said treating said portion of said substrate with said second GCIB further comprises introducing one or more elements selected from a group consisting of B, C, Si, Ge, N, P, As, O, S, F, Cl, and Br to said amorphous sub-layer.

18. The method of claim 1, further comprising:
post-treating said first portion of said substrate with, an elevated temperature thermal anneal, a pulsed laser beam anneal, or a pulsed electron beam anneal, or any combination of two or more thereof.

* * * * *